United States Patent [19]

Felix

[11] Patent Number: 5,646,567

[45] Date of Patent: Jul. 8, 1997

[54] SCAN TESTABLE DOUBLE EDGE TRIGGERED SCAN CELL

[75] Inventor: Stephen Felix, Bristol, United Kingdom

[73] Assignee: SGS-Thomson Microelectronics Limited, Almondsbury, United Kingdom

[21] Appl. No.: 518,421

[22] Filed: Aug. 24, 1995

[30] Foreign Application Priority Data

Sep. 1, 1994 [GB] United Kingdom ............... 9417591

[51] Int. Cl.⁶ .......................... H03K 3/289; H03K 3/356
[52] U.S. Cl. ........................ 327/202; 327/199; 327/203; 327/211; 327/212
[58] Field of Search ........................... 327/199–204, 327/208–214; 371/22.3

[56] References Cited

U.S. PATENT DOCUMENTS 4,629,909 12/1986 Cameron .................. 327/279
5,032,739 7/1991 Koh ......................... 327/403
5,130,568 7/1992 Miller et al. ............... 327/202
5,172,011 12/1992 Leuthold et al. ........... 307/272.2
5,179,295 1/1993 Mattison et al. ............ 307/289
5,317,205 5/1994 Sato ......................... 327/199

FOREIGN PATENT DOCUMENTS 0137165 4/1985 European Pat. Off. ....... H03K 3/356

Primary Examiner—Timothy P. Callahan
Assistant Examiner—T. Lam
Attorney, Agent, or Firm—Wolf, Greenfield & Sacks, P.C.; James H. Morris

[57] ABSTRACT

A scan cell is described which can function as either a positive edge triggered latch or a double edge triggered latch during normal functional operation of circuitry to be scan tested. It functions only as a positive edge triggered latch when scan testing of a logic structure is to be performed.

12 Claims, 12 Drawing Sheets

SCAN TESTABLE DOUBLE EDGE TRIGGERED SCAN CELL

FIELD OF THE INVENTION

The present invention relates to a scan cell which enables scan testing to be carried out.

BACKGROUND TO THE INVENTION

Scan testing is a well established technique for checking the functionality of logic circuits. A brief explanation of scan testing follows by way of background to the invention.

FIG. 1 illustrates schematically the structure of part of a functional logic circuit. The functional logic circuit can be considered to consist of blocks of combinational logic 2a, 2b connected to clocked memory elements or latches 4a, 4b, 4c. The combinational logic blocks represent purely combinational logic, that is where the output depends only on an extant set of inputs with no clocked circuits. The latch 4a receives as its data input an output on line 7a from the combinational logic block 2a, and generates its output on line 6a. The latch 4b receives as its data input another input on line 7b from the combinational logic block 2a, and generates its output on line 6b. The latch 4c receives as its data input an output on line 7c from the combinational logic block 2b, and generates its output on line 6c. The combinational logic block 2a receives a plurality of data inputs 5a to 5e. The data input 5a is taken from the output line 6a and the data input 5e is taken from the output line 6b. The combinational logic block 2b receives a plurality of inputs 5f, 5g, 5h and 5e. It will be understood that the structure of FIG. 1 is given only by means of an illustrative example and the combinational logic blocks 2a and 2b may in practice have a much larger number of inputs. It will also be understood that in the example of FIG. 1 additional combinational logic blocks and latches do in practice exist. The latches 4a, 4b and 4c are clocked by a common clock signal CLOCK connected to the respective latches by means of a common clock signal line 8.

It is desirable to test the structure of the combinational logic blocks placed between memory elements to ensure they function correctly. To do this it is necessary to put known test bits on the inputs of the combinational logic blocks and then check that the results generated at the outputs of the combinational logic blocks are those expected for the given test bits on the inputs. This is achieved by replacing each of the latches 4a, 4b and 4c in the functional logic circuitry of FIG. 1 with a respective scan cell 10a, 10b and 10c as is shown in FIG. 2. In FIG. 2, like reference numerals have been used for components and connections which are common to FIG. 1.

Referring to FIG. 2, each of the scan cells 10a, 10b and 10c comprises a multiplexor 12a, 12b and 12c and a latch 16a, 16b and 16c. The latches 16a, 16b and 16c may be the same as the latches 4a, 4b and 4c of FIG. 1. The multiplexor 12a has an input DATAIN on line 18a connected to the output generated by the combinational logic block 2a on line 7a, and an input SCANIN on line 20a connected to an output of a control circuit 11 on line 3. The multiplexor 12b has an input on line 18b connected to the output generated by the combinational logic block 2a on line 7b, and an input on line 20b connected to the output line 6a. The multiplexor 12c has an input on line 18c connected to the output generated by the combinational logic block 2b, and an input on line 20c connected to the output line 6b. The outputs of the multiplexors 12a, 12b and 12c are respectively connected to the latches 16a, 16b and 16c via the signal lines 24a, 24b and 24c. The output CELLOUT of the latch 16a on line 22a is connected to the output signal line 6a, the output of the latch 16b on line 22b is connected to the output signal line 6b, and the output of latch 16c on line 22c is connected to the output signal line 6c, which in turn is connected to the control circuit 11 via line 9. The latches 16a, 16b and 16c are clocked by the common clock signal CLOCK on line 8, and the multiplexors 12a, 12b and 12c are controlled by a common control signal CONTROL1 on line 14.

The multiplexors 12a, 12b and 12c are provided for the purpose of performing scan testing. In normal functional operation the multiplexors 12a, 12b and 12c operate to provide direct connection between the signals on the input lines 18a, 18b and 18c and the signals on the output lines 24a, 24b and 24c respectively. This configuration of the multiplexors 12a, 12b and 12c is set by controlling the signal CONTROL1 on line 14. Consequently during normal functional operation the structure of FIG. 2 is configured as the structure of FIG. 1.

When a scan test is to be performed, the signal CONTROL1 on line 14 will be set such that the multiplexors 12a, 12b and 12c connect their respective inputs on lines 20a, 20b and 20c to their respective outputs on lines 24a, 24b and 24c. Thus it can be seen that the multiplexors 12a, 12b, 12c and latches 16a, 16b and 16c form a serial scan chain. In order to carry out the scan test it is necessary to place a known test bit on each of the respective input signal lines 5a to 5g of the combinational logic blocks 2a, 2b. With the multiplexors 12a, 12b and 12c configured to connect their inputs 20a, 20b and 20c to their outputs 24a, 24b and 24c a sequence of test bits is outputted serially on line 3 by the control circuit 11 under the control of the clock signal CLOCK, such that the test bits are serially clocked through the latches 16a, 16b and 16c in sequence. After a plurality of clock cycles equal to the number of scan cells in the scan chain, each of the signal lines 6a, 6b, 6c will have a known test bit thereon stored by means of the latches 16a, 16b and 16c. The outputs of the combinational logic blocks 2a, 2b will then change according to the new input values set, and these new output values will appear on the inputs 18a, 18b and 18c of the multiplexors 12a, 12b and 12c. It will be understood, as is well known in the art, that all the inputs 5a to 5g to the combinational logic blocks 2a, 2b will be connected to the output of a scan cell, even though all are not shown so connected in FIG. 2.

The multiplexors 12a, 12b and 12c are then switched, under the control of the control signal CONTROL1 on line 14, such that the inputs on line 18a, 18b and 18c of the multiplexors are connected to the respective outputs 24a, 24b and 24c of the multiplexors. The signals on the outputs 24a, 24b and 24c of the multiplexors will now be the results outputted by the combinational logic blocks 2a, 2b in response to the test bits being placed on their respective inputs. With the control signal CONTROL1 set to connect the outputs 24a, 24b and 24c to the inputs 18a, 18b and 18c the latches 16a, 16b and 16c are clocked once by the clock signal CLOCK on line 8 such that the results outputted by the combinational logic blocks 2a, 2b are latched onto the signal lines 6a, 6b and 6c respectively. The control signal CONTROL1 on line 14 is then again changed to connect the output of the multiplexors on lines 24a, 24b and 24c to their inputs on lines 20a, 20b and 20c respectively. The latches 16a, 16b and 16c are then clocked by the clock signal CLOCK such that the results latched on the outputs 6a, 6b and 6c of the latches are serially clocked out back to the controller 11 on line 9. The controller then checks to ensure that the result bits are those expected. In addition, it will be appreciated that whilst the result bits are being scanned out on the scan chain a new set of test bits can be scanned in.

It can be seen that the above technique allows the test to be carried out without the controller needing to account for the actual operation of the combinational logic circuitry 2a, 2b.

Referring now to FIG. 3, an implementation of the latch 16a of FIG. 2 is shown. The latch 16a consists of two half-latches, or transparent latches, 26a and 28a. Each half-latch consists of a respective control node (CN) 30a, 34a and a respective storage node (SN) 32a, 36a. The clock signal CLOCK on line 8 clocks the control node 34a of half-latch 28a whilst the inverse of the clock signal CLOCK, NOTCLOCK, clocks the control node 30a. It will be understood, as is well known in the art, that the clock signals CLOCK and NOTCLOCK could be non-overlapping clock signals, or alternatively circuitry in the control nodes 30a and 34a could take account of any possible overlap of the two clocks. The latches 16b and 16c of FIG. 2 similarly comprise two half-latches. It can therefore be seen that the scan cell 10a of FIG. 2 comprises two half-latches.

FIG. 4 shows the scan cell 10a of FIG. 2 redrawn with two half latches 26a, 28a rather than a single full latch 16a so as to further illustrate the fact that the scan cell can be considered to comprise two half-latches. It will be readily understood that the scan cell 10a of FIG. 4 operates in exactly the same way as the scan cell 10a of FIG. 2.

The term half-latch is used herein to denote circuitry which acts in a data transfer state to transmit a signal from its input terminal to its output terminal with the control signal in a first state and in a data holding state to store the signal on the output terminal with the control signal in the second state. A simple implementation of a half-latch is an FET transister having its source/drain channel connected between the input terminal and the output terminal and its gate connected to receive the control signal. There is sufficient capacitance inherent in the transistor to provide the storage requirement at the output terminal. However, the storage capacity can be improved by providing an extra storage transistor. Other implementations of a half-latch are known and any suitable implementation can be used in the circuit of this invention.

It should be understood from the latch presented in FIG. 3 that the latches 16a, 16b and 16c are single edge triggered latches, and more specifically are positive edge triggered latches. Referring to FIG. 3 it will be seen that when the clock signal CLOCK is low the data on the input 24a of the latch will be transferred to the intermediate node 38a of the latch because the half-latch 26a is transparent. This data on intermediate node 38a will not be transferred to the output 22a of the latch, however, because whilst the clock signal CLOCK is low the half-latch 28a is in a data retention state. However, on a rising edge (or positive edge) of the clock signal CLOCK the data on the intermediate node 38a will be transferred to the output 22a of the latch because the half-latch 28a is transparent when the clock signal is high. It can therefore be seen that the latch 10a is called a positive edge triggered latch because data on its input 24a is transferred to its output 22a as a result of the positive transition of the clock signal CLOCK. On a negative transition there is no change to the output 22a because the half latch 28a reverts to a data storage state.

Referring back to FIG. 2, it will now be apparent that during the scan test and during normal functional operation the latches 16a, 16b and 16c function as positive edge triggered latches. Provided the latches 4a, 4b and 4c of FIG. 1, which the scan cells 10a, 10b and 10c of FIG. 2 have replaced, are also only positive edge triggered latches the structure of FIG. 2 will function adequately during both normal functional operation and during scan test.

However, a problem arises if the latches 4a, 4b and 4c of FIG. 1 are double-edge triggered latches. In a double-edge triggered latch the data value on the input is transferred to the output on both negative and positive clock transitions, i.e., twice in any given clock cycle. It will be apparent that the scan cell of FIG. 4 cannot latch on negative edge clock transitions, and that if the scan cell of FIG. 4 is used to replace double edge triggered scan latches 4a, 4b and 4c of FIG. 1 during normal functional operation of the circuit data will be lost. This is apparent since if a positive edge triggered latch replaces a double edge triggered latch and the controller still operates as if the latches were double-edge triggered latches, the data in the circuit will become corrupt or lost.

Double edge triggered latches are commonly used in circuits where it is desirable to have a fast clock as well as the normal system clock. As it is also desirable to minimise clock distribution to save layout space, double edge triggered latches offer an option of providing components operating at more than one speed of operation but which require only a single clock. Such techniques also have advantages in saving power, since it is only necessary to generate one source clock signal for two speeds of operation.

It is therefore an object of the present invention to provide a scan cell which can function as either a positive edge triggered latch or a double edge triggered latch during normal functional operation of the circuitry intended to be scan tested, but to enable it to function only as a positive edge triggered latch when scan testing of a logic structure is being performed.

SUMMARY OF THE INVENTION

According to the present invention there is provided a scan cell having:

a data input terminal and a data output terminal;

a first latch connected to receive an input signal from the data input terminal and having a first data output path connected to the data output terminal and which is triggered on a positive edge of a clock signal to transfer the input signal to the data output terminal;

a second latch connected to receive an input signal from the data input terminal and having a second data output path connected to the data output terminal and which is triggered on a negative edge of a clock signal to transfer the input signal to the data output terminal;

a first switch connected in the second data output path and responsive to a negative edge trigger disable control signal (NETE) to selectively disconnect said path, whereby with the second data output path connected the scan latch functions as a double edge triggered latch, and with the second data output path disconnected the scan latch functions as a positive edge triggered latch.

Further embodiments provide such a scan cell which is fully scan testable, and which is compatible with boundary scan testing according to IEEE Standard 1149.1-1990.

For a better understanding of the present invention and to show how the same may be carried into effect, reference will now be made by way of example to FIGS. 5 to 11 of the accompanying drawings.

DESCRIPTION OF THE PREFERRED EMBODIMENT

Figure 4:
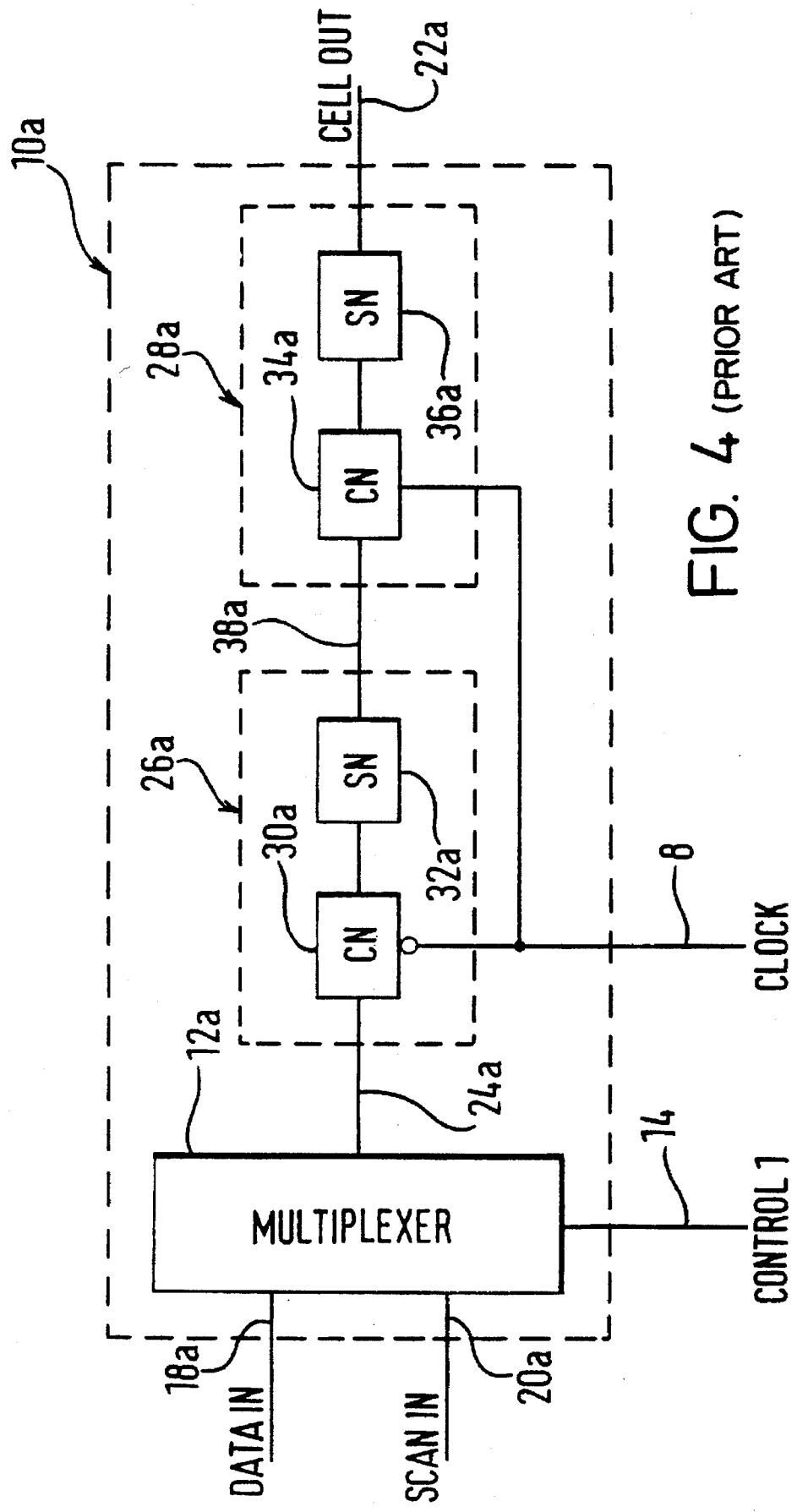
FIG. 4 illustrates the scan cell of FIG. 2 implemented using half latches.
Figure 5:
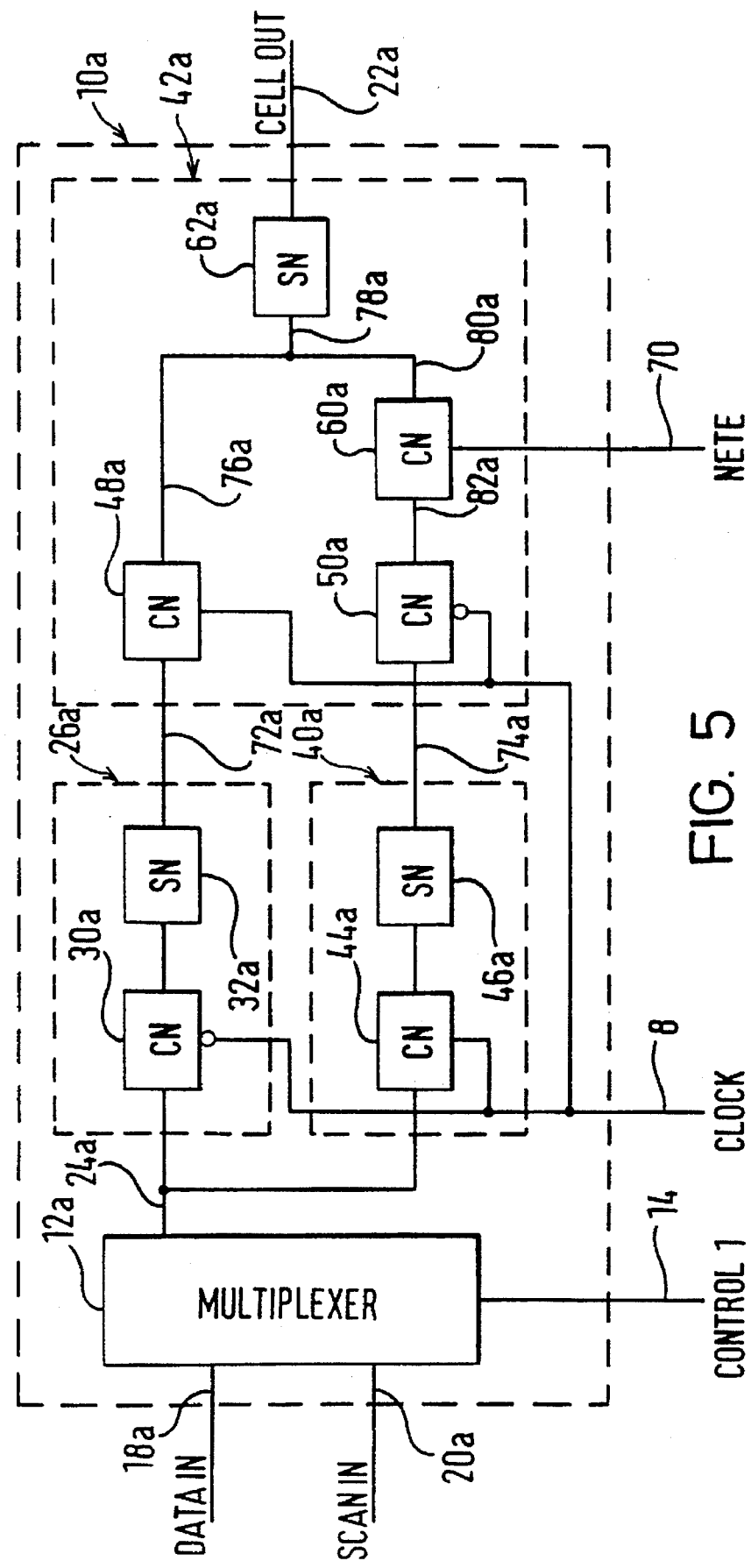
FIG. 5 is a circuit diagram of a scan cell in accordance with one embodiment of the invention.

Reference is first made to FIG. 5 which illustrates a scan cell according to one aspect of the present invention which can be used in place of the scan cell of FIG. 4. Reference numerals are the same as for like parts in FIGS. 1 to 4.

In the scan cell 10a of FIG. 5, the output 24a of the multiplexor 12a not only supplies an input to the half latch 26a but also supplies an input to an additional half latch 40a. The half latch 40a comprises a control node (CN) 44a which is clocked by the signal CLOCK on line 8 and which receives as an input the signal on line 24a. The output of the control node (CN) 44a is connected to a storage node (SN) 46a of the half-latch 40a. It can be seen that the control nodes (CN) 30a and 44a of the respective half latches 26a, 40a are controlled by the clock signal CLOCK on line 8 and the inverse of the clock signal NOTCLOCK respectively such that when one is transparent the other is in a data retention state.

The half-latch 28a of FIG. 4 has been replaced by a half-latch 42a comprising control nodes (CN) 48a, 50a, 60a and a storage node (SN) 62a. The control node (CN) 48a receives its input from the output of the storage node (SN) 32a of half latch 26a via line 72a, and generates its output on line 76a. The control node (CN) 50a receives its input from the output of the storage node (SN) 46a of half latch 40a via line 74a, and generates its output on line 82a. The control node (CN) 60a receives as its input the signal on line 82a and generates its output on a signal line 80a. The storage node (SN) 62a receives its input on a signal line 78a which is connected to the signal lines 76a and 80a, and the output of the storage node (SN) 62a forms the output signal CELLOUT of the scan cell 10a on line 22a. The control node (CN) 48a is controlled by the clock signal CLOCK on line 8 and the control node (CN) 50a is controlled by the inverse of the clock signal CLOCK, NOTCLOCK, on line 8. It can therefore be seen that the control node 48a cooperates with control node 30a to perform the function of a positive edge triggered latch and control node 50a cooperates with control node 44a to perform the function of a negative edge triggered latch. Finally, the control node (CN) 60a is controlled by a negative edge trigger enable control signal NETE on line 70.

The scan cell of FIG. 5 can now be controlled to function in three distinct modes of operation, two of which are associated with normal functional operation of the combinational logic circuitry and one of which is associated with scan testing.

Figure 1:
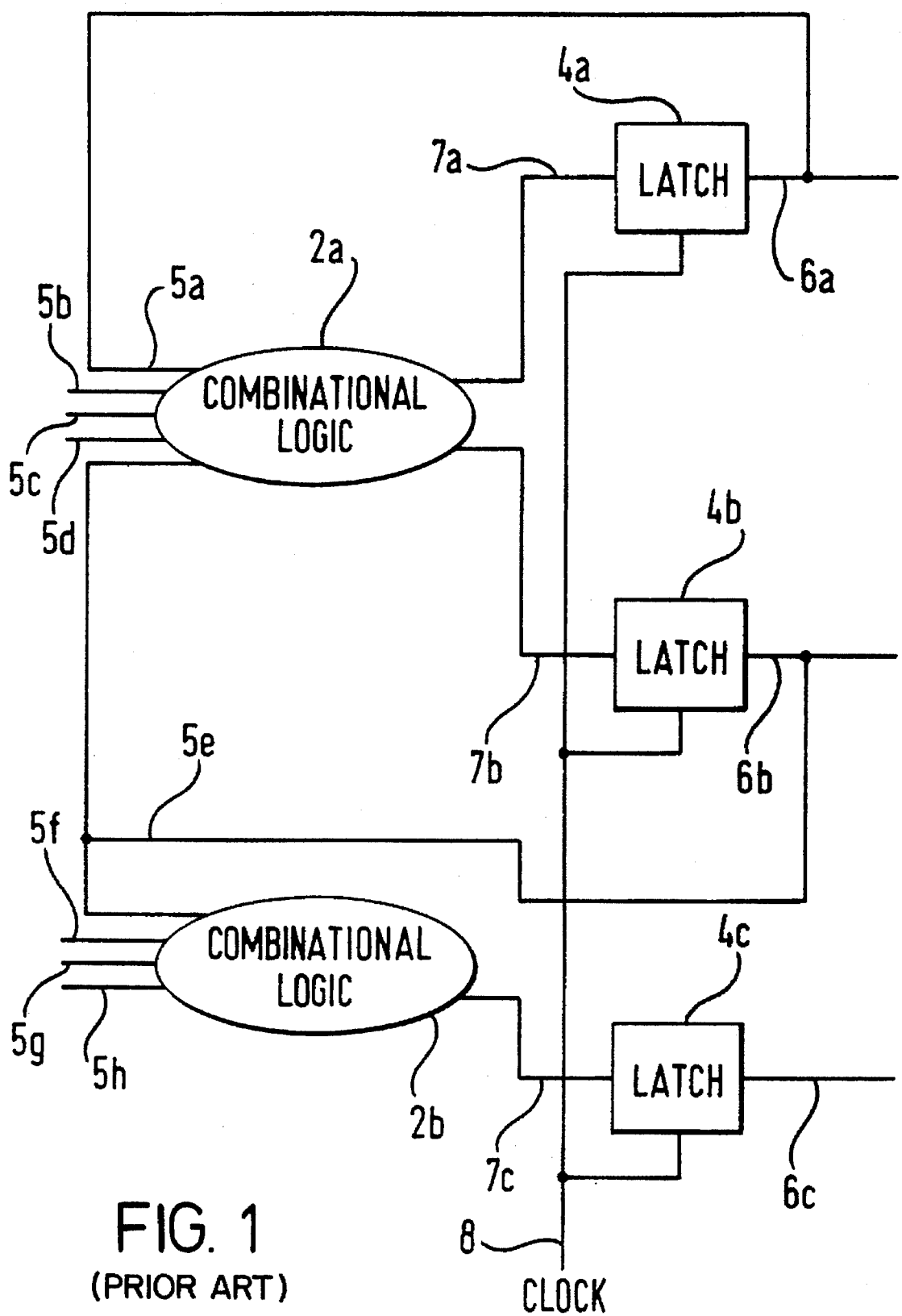
FIG. 1 is a block diagram of part of a functional logic structure.

The first mode of operation concerns the case where the latch 4a of FIG. 1 operates as a positive edge triggered latch during normal functional operation. When the scan cell 10a of FIG. 5 is substituted for the latch 4a of FIG. 1 to facilitate the option of scan test the negative edge trigger enable control signal NETE on line 70 is set such that the control node (CN) 60a is maintained in its data retention state. This means that the control nodes (CN) 44a, 50a have no effect on the operation of the scan cell 10a, i.e., the control node (CN) 60a is effectively an open circuit disconnecting its input 82a from its output 80a. It can therefore be seen that in this condition the scan cell 10a of FIG. 5 operates as a positive edge triggered latch during normal operation of the combinational logic circuitry in exactly the same manner as the scan cell 10a of FIG. 2.

The second mode of operation concerns the case where the latch 4a of FIG. 1 operates as a double edge triggered latch during normal functional operation. When the scan cell 10a of FIG. 5 is substituted for the latch 4a of FIG. 1 to facilitate the option of scan test the negative edge trigger enable control signal NETE on line 70 is set such that the control node (CN) 60a is maintained in its data transfer state. This means that the control nodes (CN) 44a, 50a do have an effect on the operation of the scan cell 10a, i.e., the control node (CN) 60a is effectively a short circuit, connecting its input on line 82a to its output on line 80a. It can therefore be seen that in this condition the scan cell 10a of FIG. 5 operates as a double edge triggered latch during normal operation of the combinational logic circuitry. The half latch 26a in combination with the control node (CN) 48a and storage node (SN) 62a of half latch 42a act as a positive edge triggered latch, and the half latch 40a in combination with control node (CN) 50a and storage node (SN) 62a act as a negative edge triggered latch (the control node 60a essentially forming a short circuit). The positive edge triggered latch and the negative edge triggered latch act in parallel to form a double edge triggered latch.

The third mode of operation concerns the case where the scan cell of FIG. 5 is being used to perform a scan test. In this case regardless of whether the latch 4a of FIG. 1 is a positive edge triggered latch or a double edge triggered latch during normal functional operation, the negative edge trigger enable control signal NETE on line 70 will be set to disable negative edge triggering such that the control node (CN) 60a is effectively an open circuit, disconnecting its input on line 82a from its output on line 80a, and the half-latches 26a and 42a only will operate and a positive edge triggered latch is formed as described above.

It can therefore be seen that the invention provides a versatile scan cell which can be controlled to function as either a positive edge triggered latch or a double-edge triggered latch as required during normal functional operation, and which can be controlled to function only as a positive edge triggered latch during scan testing.

Figure 6:
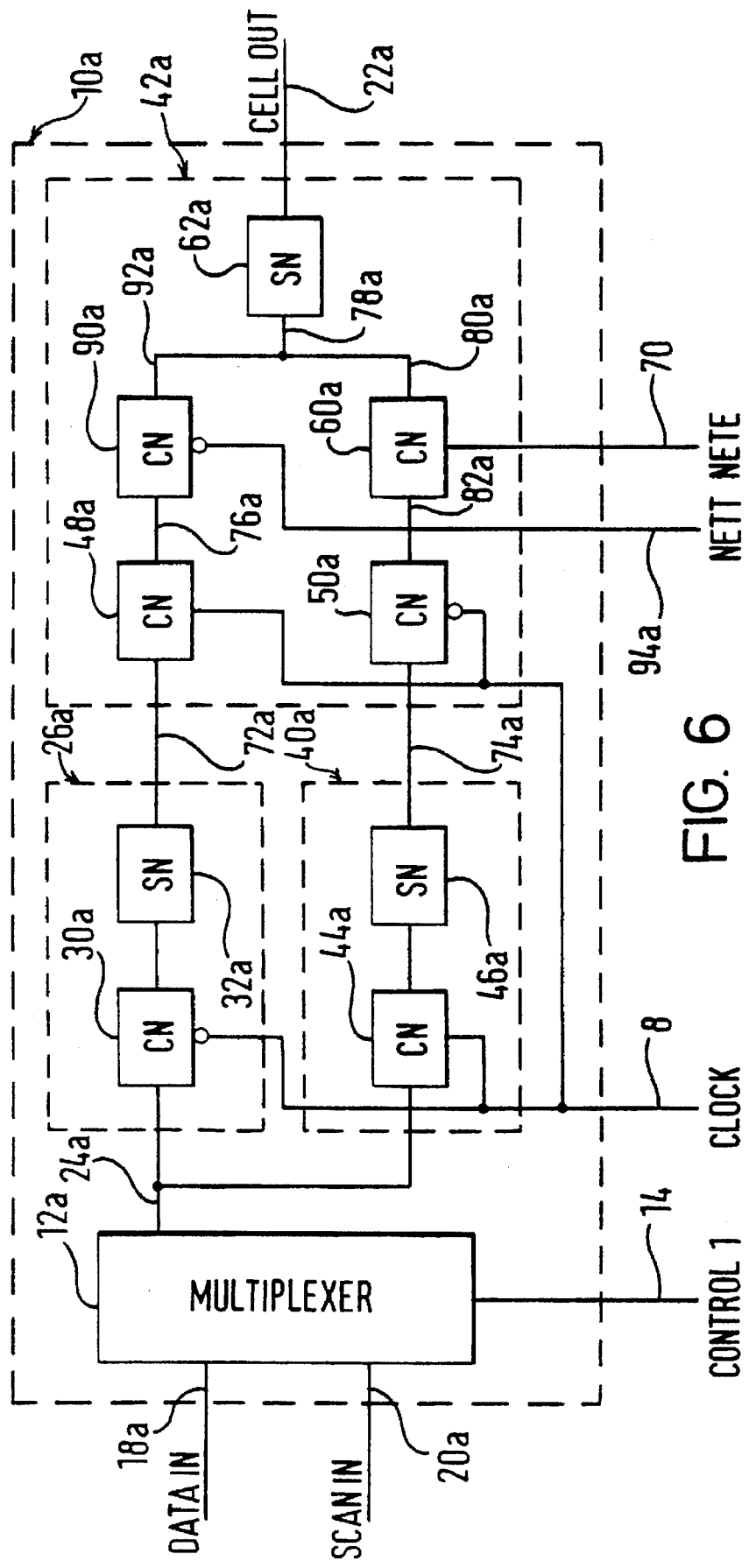
FIG. 6 is a circuit diagram of a scan cell in accordance with another embodiment of the invention.

Although the circuit of FIG. 5 has provided a more versatile scan cell, circuit elements have been added which cannot be satisfactorily tested, these being the half-latch 40a and the control nodes (CN) 50a, 60a of the half-latch 42a. The positive edge triggered latch can be tested by providing the control node 60a which disables the negative edge triggered latch. It can therefore be understood that to facilitate testing of the circuit elements forming the negative edge triggered latch it is necessary to provide some way of disabling the circuit elements of the positive edge triggered latch and enabling the negative edge triggered latch. The scan cell 10a of FIG. 6 provides such a capability. In FIG. 6, reference numerals are the same as for like parts of FIGS. 1 to 5.

In FIG. 6, an additional control node (CN) 90a has been added to the half latch 42a. The control node (CN) 90a receives as its input the output of the control node (CN) 48a on line 76a, and generates an output on a line 92a. The line 92a is connected to the line 78a which forms the input to the storage node (SN) 62a. The line 76a is no longer connected to the line 78a. The control node (CN) 90a is controlled by the inverse of a negative edge trigger test control signal NETT on line 94a.

During normal functional operation the negative edge trigger test control signal NETT is held such that the control node (CN) 90a always connects the signal line 76a to the signal line 92a, i.e., the control node (CN) 90a functions as a short circuit connecting its input on line 76a to its output on line 92a. It will therefore be appreciated that during normal functional operation the scan cell 10a of FIG. 6 will function as either a positive edge triggered latch or as a double edge triggered latch under the control of the negative edge trigger enable signal NETE as has been fully described hereinabove with reference to FIG. 5.

During a normal scan test the negative edge trigger test control signal NETT is still held such that the control node (CN) 90a connects the signal line 76a to the signal line 92a. In this way a scan test can be carried out as fully described hereinabove with respect to FIG. 5 by controlling the negative edge trigger enable control signal NETE to disable the control node (CN) 60a. From the foregoing description it will be apparent that a scan test can be used to test the positive edge triggered latch comprising the half latch 26a and the control nodes 48a, 90a and the storage node 62a of the half latch 42a.

The scan cell 10a of FIG. 6 can also test the negative edge triggered latch comprising the half-latch 40a and the control nodes 50a, 60a and the storage node 62a of the half latch 42a. When it is desired to test the negative edge triggered latch the negative edge trigger enable control signal NETE is set such that the control node (CN) 60a connects the signal line 82a to the signal line 80a, and the negative edge trigger test control signal NETT is set such that the control node (CN) 90a disconnects the signal line 76a from the signal line 92a. With the signal CONTROL1 on line 14 set such that the multiplexor 12a connects its output on line 24a to the input signal SCANIN on line 20a, serial test data is then scanned in through the SCANIN signal input to the CELLOUT signal output on line 22a through the negative edge triggered latch under the control of the clock signal CLOCK on line 8. The serial bits scanned out on the output CELLOUT are then compared to those scanned in on the input SCANIN and thus the negative edge triggered latch is tested.

Figure 2:
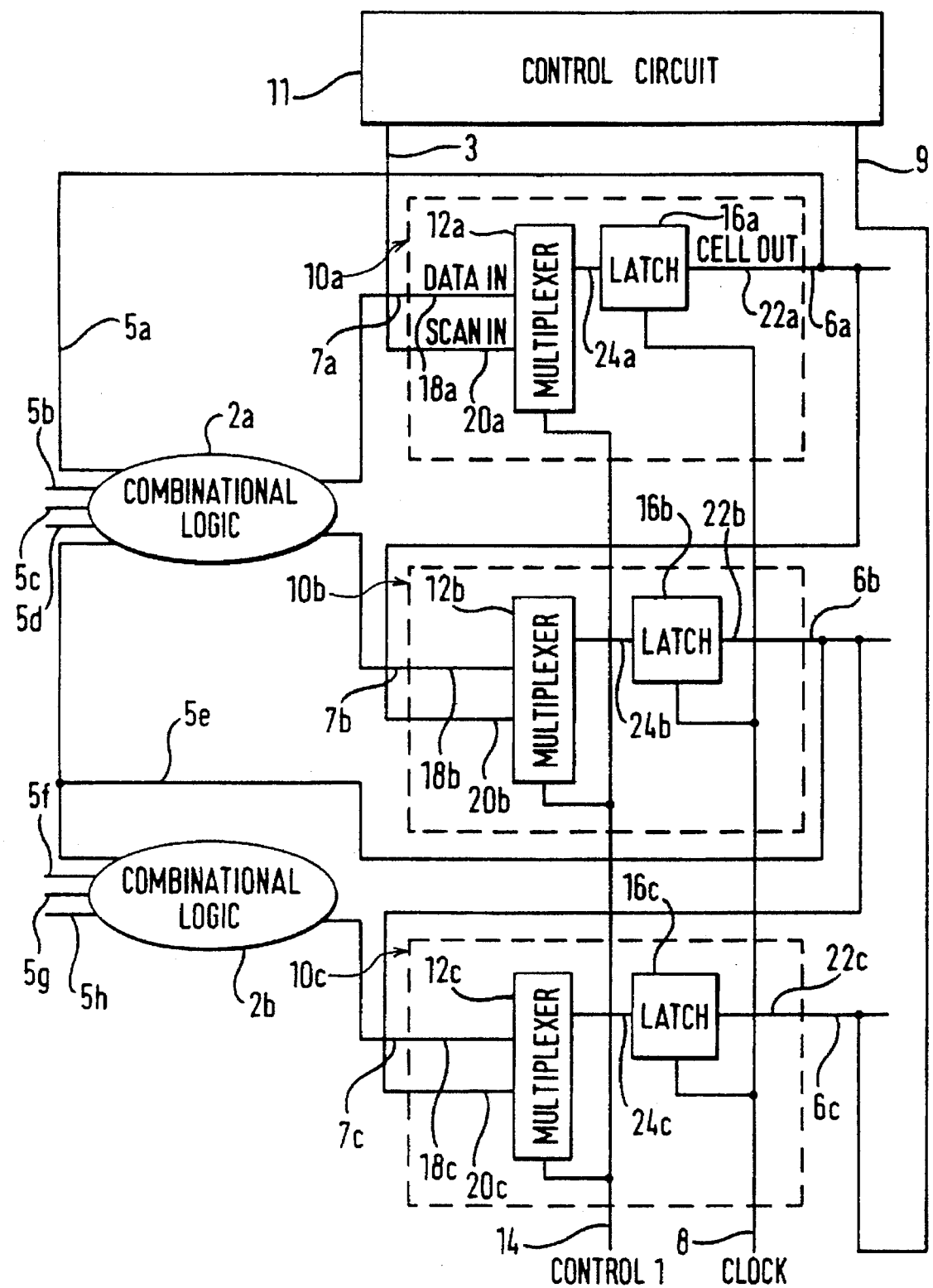
FIG. 2 is a block diagram of the functional logic structure of FIG. 1 adapted to include scan cells for performing scan testing.
Figure 3:
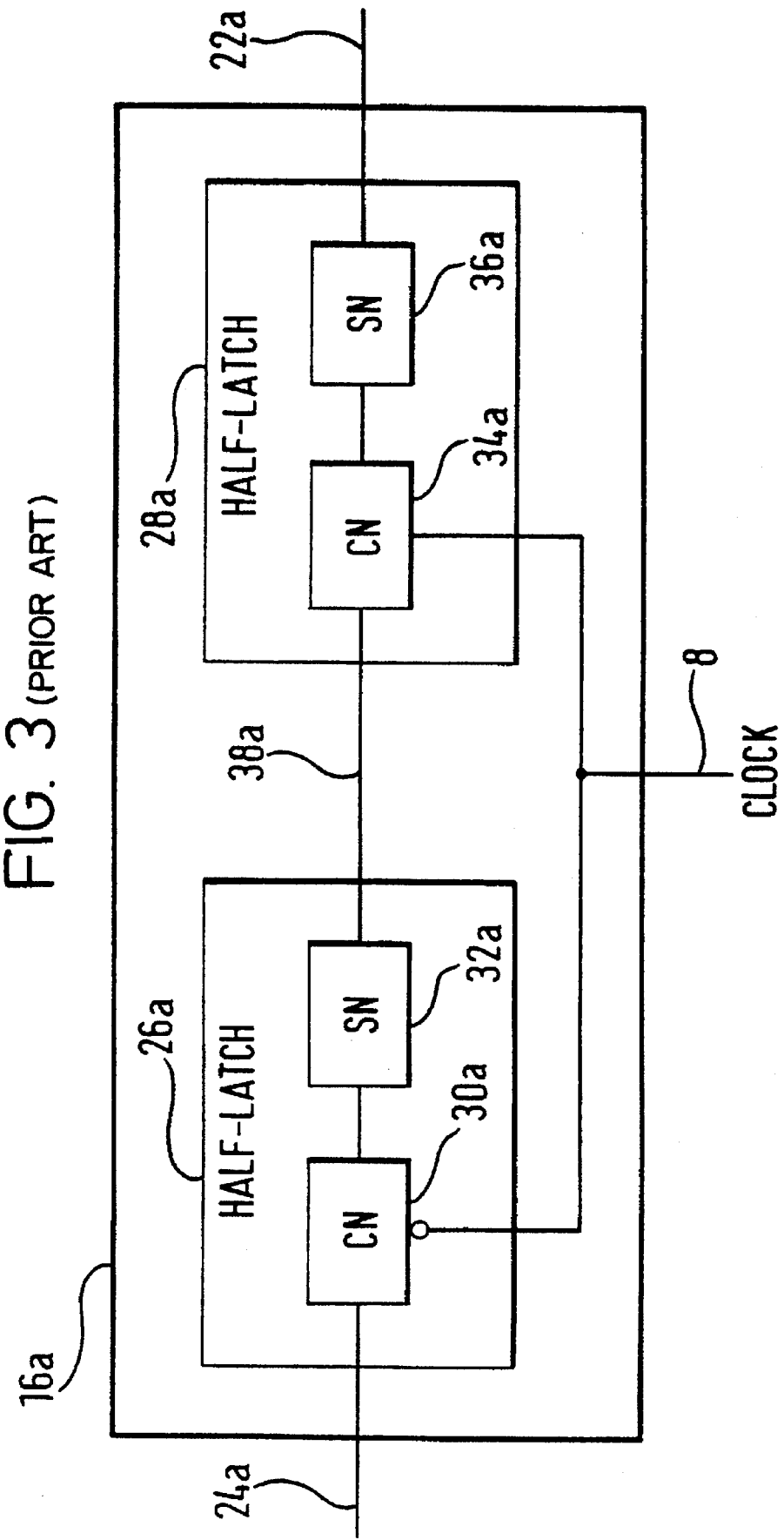
FIG. 3 is an example of an embodiment of a synchronous scan latch using half latches.

The negative edge triggered circuitry could be also tested by carrying out a scan test as was described hereinabove with reference to FIG. 2, the only difference being that a scan test bit or result bit on the output 24a of the multiplexor 12a is transferred to the output CELLOUT 22a of the scan cell on negative transitions of the clock signal CLOCK on line 8. In this way a scan test is performed which tests the negative edge triggered latch of the scan cell 10a. However, it should be understood that such a structural test will be unnecessary if a structural scan test using the positive edge circuitry has been carried out. Nevertheless, it would be efficient to perform a structural test using the negative edge circuitry and then test the positive edge circuitry using a simple scan in and scan out comparison test as described hereinabove for the negative edge circuitry. It will be understood that the structural scan test works as well for the scan cell 10a of FIG. 6 configured as a negative edge triggered latch as it does for the scan cell 10a of FIG. 6 configured as a positive edge triggered latch. The important feature during this type of structural scan testing is that latching can occur on only one or the other of the two edges in a clock cycle, and not on both.

Consequently, the scan cell 10a of FIG. 6 provides a versatile scan cell which can be controlled to function as either a positive edge triggered latch or a double-edge triggered latch as required during normal functional operation, but which can be further controlled to function only as either a positive edge triggered latch or a negative edge triggered latch during scan testing, such that the scan cell is fully scan testable.

The scan tests thus far described test the functionality of the combinational logic blocks 2a and 2b, that is to say the functional performance of the structure of the combinational logic blocks is tested. Such a structural test is limited to determining the logical correctness of an output for a particular extant set of inputs. It is also desirable to test the timing aspects of combinational logic blocks by means of a so-called "performance test". The performance test enables the performance of the combinational logic blocks (rather than the performance of the logic function) to be tested. In order to carry out a performance test it is necessary to sensitise the inputs of the combinational logic with one set of sensitise bits and allow the output of the combinational logic to settle. The inputs are then changed to a set of activation bits. The time taken for the output to change from the value set in response to the sensitise input to the value set in response to the activation input is a measure of the performance of the combinational logic.

Figure 7:
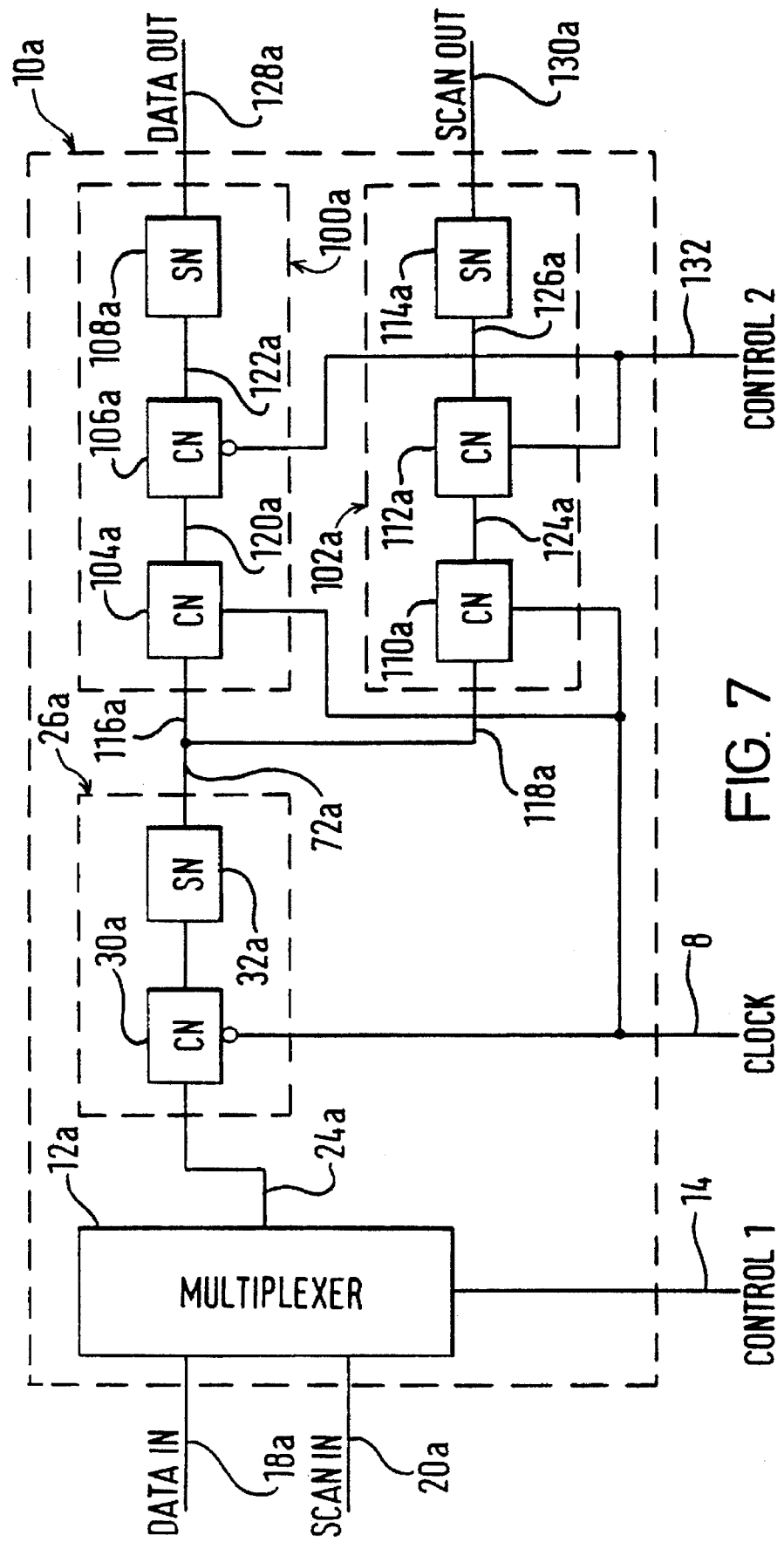
FIG. 7 is a circuit diagram of a known scan cell suitable for carrying out an efficient performance scan test.

Scan cells which allow such performance scan testing to be carried out as well as structural scan testing are described for example in our co-pending Application No. (Page White & Farrer Ref. No. 79209) the contents of which are herein incorporated by reference. An embodiment of such a novel scan latch is illustrated in FIG. 7. In FIG. 7, reference numerals are the same as for like parts in FIGS. 1 to 6.

The scan cell 10a of FIG. 7 comprises the multiplexor 12a and the half latch 26a, together with two additional half latches 100a and 102a. The half latch 26a is referred to as a capture half-latch, the half-latch 100a is referred to as an update half-latch, and the half-latch 102a is referred to as a release half latch.

The multiplexor 12a has the same input, output and control signals as previously described, as does the scan half latch 26a. The multiplexor 12a and the scan half latch 26a are interconnected in the same manner as previously described. The update half latch 100a comprises two control nodes (CN) 104a, 106a and a storage node 108a. The input of the control node (CN) 104a is the input to the update half-latch 100a on line 116a and is connected to the output of the scan half-latch 26a on line 72a. The output of the control node (CN) 104a is connected to the input of the control node (CN) 106a on line 120a, and the output of the control node (CN) 106a is connected to an input line 122a of the storage node (SN) 108a. The output of the storage node (SN) 108a forms the output signal DATAOUT of the scan cell on line 128a. The release half latch 102a comprises two control nodes (CN) 110a, 112a and a storage node (SN) 114a. The input of the control node (CN) 110a is the input to the release half-latch 102a on line 118a and is connected to the output of the scan half latch 26a on line 72a. The output of the control node (CN) 110a is connected to the input of the control node (CN) 112a on line 124a, and the output of the control node (CN) 112a is connected to an input line 126a of the storage node (SN) 114a. The output of the storage node (SN) forms the output signal SCANOUT of the scan cell on line 130a. The control nodes 104a and 110a are controlled by the clock signal CLOCK on line 8. The control node 112a is controlled by a control signal CONTROL2 on line 132 and the control node 106a is controlled by the inverse of the control signal CONTROL2. The control nodes 106a, 112a are essentially enable gates for the respective half latches 100a, 102a as will become apparent in the following description. The scan cell output DATAOUT on line 128a will be connected to the DATAIN input of the next block of combinational logic, and the scan cell output SCANOUT on line 130a will be connected to the SCANIN input of the next scan cell in the scan chain.

In the scan cell 10a for carrying out a performance test illustrated in FIG. 7, the capture half latch 26a, release half latch 102a and update half latch 100a are all controlled by a common clock signal. When such a common clock signal is used it is essential to introduce the control nodes (CN) 106a and 112a to additionally control the update and release half latches during performance or structural testing.

An alternative embodiment of a scan cell using three half latches, but not requiring the two control nodes 106a and 112a, is described in our copending British Patent Application No. (Page White & Farrer Ref. No. 74886). In such a scan cell the removal of the two control nodes 106a and 112a requires the three half latches to be controlled by three independent clock signals, the timing of which can be individually controlled. Such a scan cell will not be described in detail herein but it will be apparent to a person skilled in the art having reference to this document how the present invention may be applied thereto.

The scan cell illustrated in FIG. 7 is particularly suited to carrying out a performance test since power consumption and routing overheads etc are reduced by the requirement of only a single clock.

The operation of the scan cell 10a of FIG. 7 in carrying out a performance test will now be described.

During normal functional operation, the multiplexor 12a is controlled by the control signal CONTROL1 on line 14 such that its output on line 24a is connected to the DATAIN signal on line 18a. The control signal CONTROL2 on line 14 is set such that the control node 106a connects its output on line 122a to its input on line 120a, and the control node 112a disconnects its output on line 126a from its input on line 124a. Consequently the update half latch 100a is enabled and the release half latch 102a is disabled. It will therefore be appreciated that in these circumstances the scan cell 10a of FIG. 7 operates as a positive edge triggered latch under the control of the clock signal CLOCK, with data on the DATAIN input line 18a being clocked through to the DATAOUT line 128a on the positive edge of each clock cycle of the clock CLOCK.

The sequence for carrying out the actual performance test will now be briefly described. For a detailed understanding of the operation of such test reference should be made to copending British Patent Application No. (Page White Farrer Ref. No. 74886).

When the controller indicates that a performance test is to be carried out, the control signal CONTROL1 on line 14 is switched such that the output of the multiplexor on line 24a is connected to the input SCANIN of the multiplexor on line 20a. The control signal CONTROL2 is set such that the update half-latch 100a is disabled and the release half latch 102a is enabled. The controller then serially outputs on the SCANIN signal line 20a sensitise test bits which are clocked serially through the successive scan cells in the scan chain from the SCANIN input on line 20a to the SCANOUT output on line 130a. It will be understood that a situation will be reached where the sensitise test bit applicable to the scan cell 10a is present on the SCANIN signal line 20a. On the next falling edge of the clock signal CLOCK the capture half latch 26a becomes transparent and this sensitise bit will be transferred to the output line 72a of the half latch 26a. Before the next rising edge of the clock cycle CLOCK the control signal CONTROL2 is switched such that the update half latch 100a is enabled and the release half latch 102a is disabled. Then, on the positive edge of the clock signal CLOCK the sensitise test bit on the output line 72a of the capture half latch will be transferred to the output of the update half latch 100a and consequently the DATAOUT output 128a of the scan cell. Thus the inputs to all the combinational logic blocks are updated to the respective sensitise bits and after a short delay the outputs of the combinational logic blocks, which appear on the DATAIN input signal lines, will change to a new value.

The control signal CONTROL2 then reverts back to its previous state such that the update half latch 100a is disabled again and consequently the sensitise test bit is retained on the DATAOUT output line 128a.

The controller then serially outputs on the SCANIN signal line 20a activation test bits which are clocked serially through the successive scan cells in the scan chain in the same way that the sensitise test bits were scanned in. As with the sensitise test bits a situation will be reached where the activation test bit applicable to the scan cell 10a is present on the SCANIN signal line 20a. By the same sequence of steps described hereinbefore the scan cell is clocked and controlled such that after a positive edge of the clock signal CLOCK the activation test bit will be transferred to the DATAOUT output 128a of the scan cell. Thus the input to all the combinational logic blocks are updated to the respective activation test bits.

After the positive edge of the clock signal CLOCK which causes this update, a negative edge is forced on the clock signal CLOCK by means of the controller earlier than would normally be expected with the normal clock cycle, and the activation test bit is therefore retained on the output DATAOUT since the update half latch 100a will now be disabled. The control signals CONTROL1 and CONTROL2 are then switched such that the multiplexor 12a connects its output on line 24a to its DATAIN input on line 18a, and the update half latch is disabled by the control node 106a and the release half latch is enabled by the control node 112a. After a short delay a new result will appear on the DATAIN signal line 18a which is a consequence of the activation test bit applied to the input of the combinational logic block, and as the capture half latch is in the data transfer state this result will be transferred to the output of the capture half latch on line 72a. The clock signal CLOCK is then forced high (under the control of the controller) earlier than would normally be expected and this positive clock edge causes the result to be retained on the line 72a since the half-latch 26a will now be disabled. Thus the result has been "captured" by the scan cell. It will be appreciated that the time between the activation input being applied to the input of the combinational logic block and the result being captured by controlling the timing of the first positive clock edge of the signal CLOCK after the positive clock edge of the signal CLOCK which updates the DATAOUT output signal on line 128a with the activation test bit is adjustable under control of the controller.

If the scan cell 10a of FIG. 7 was being used to perform only a structural test and not a performance test, then there would be no need for the controller to force the early positive clock edge of the clock signal CLOCK. The timing of the capture of the result is not important for a structural test and so it would be acceptable to await the next positive clock edge in the normal cycle of the clock signal CLOCK. It will also be understood that for a structural test there is no requirement to scan in sensitise test bits, only activation test bits being required.

The captured result on each scan cell can then be scanned out under the control of the clock signal CLOCK in the same manner that the sensitise and activation bits were scanned in. It will be appreciated that whilst the captured results are being scanned out by the controller, a new set of sensitise test bits may be scanned in.

Preferably the sensitise bit pattern supplied to the chain of scan latches activates a critical timing path on the transition of the inputs of the combinational logic blocks between the sensitise and activation patterns. It will be readily appreciated that the point of a performance test is to measure the time between placing the activation input bits on the inputs of the combinational logic blocks and the appearance of the result on the DATAIN input signal line 18a. The performance test sequence can be repeated for different patterns to exercise different timing paths.

Figure 8:
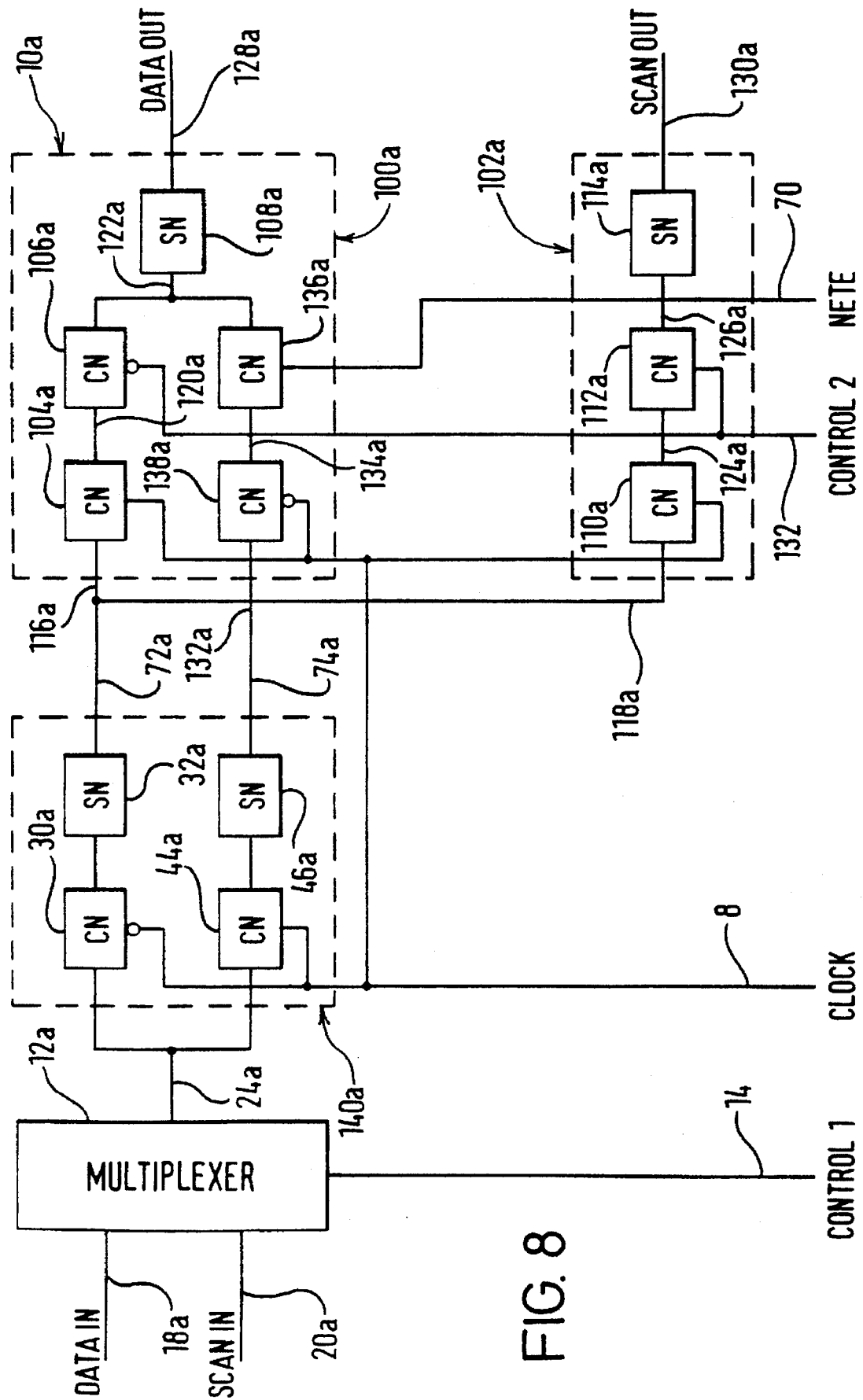
FIG. 8 is a circuit diagram of the known scan cell of FIG. 7 adapted in accordance with one embodiment of the invention.

It will be appreciated that the scan cell 10a illustrated in FIG. 7 can only be used as a positive edge triggered latch during normal functional operation, and can therefore not be used in circuits where the latches normally function as double edge triggered latches. However, the scan cell 10a of FIG. 7 can be modified in accordance with the present invention described as hereinbefore with reference to FIG. 6 to allow double-edge triggered latching during normal functional operation, as is shown in FIG. 8. In FIG. 8, reference numerals are the same as for like parts in FIGS. 1 to 7.

The scan cell 10a of FIG. 8 comprises the multiplexor 12a and the half-latches 26a and 40a, which together in combination can be considered to be a versatile capture half-latch 140a which can function as part of a positive edge triggered, negative edge triggered, or double edge triggered latch, as will be understood from the description given hereinabove with reference to FIGS. 5 and 6. The input of the control node 30a of the capture half latch 140a and the input of the control node 44a of the capture half latch 140a are both connected to the output of the multiplexor on line 24a. The update half latch 100a additionally contains a control node (CN) 138a and a control node (CN) 136a. The input of the control node 138a is connected on line 132a to the line 74a. The output of the control node 138a is connected to the input of the control node 136a via line 134a, and the output of the control node 136a is connected to the input line 122a of the storage node 108a. The control node 138a is controlled by the inverse of the clock signal CLOCK on line 8 and the control node 136a is controlled by the negative edge trigger enable control signal NETE on line 70.

It should therefore be apparent that during normal functional operation the control signal CONTROL2 is set such that the release half latch 102a is disabled by control node 112a and the update half latch 100a is enabled by control node 106a. The combination of capture half latch 140a and update half latch 100a will therefore function as either a positive edge triggered latch or a double edge triggered latch depending on whether the negative edge trigger enable control signal NETE on line 70 either disables or enables the control node 136a.

During scan test mode, it will be apparent that the negative edge trigger enable signal NETE on line 70 will be held such that the control node 136a disables the negative edge trigger of the combination of half latches 140a and 100a, and therefore structural and performance tests can be carried out as described hereinabove with reference to FIG. 7.

Although the circuit of FIG. 8 has provided a more versatile scan cell, circuit elements have been added which cannot be satisfactorily tested.

Figure 9:
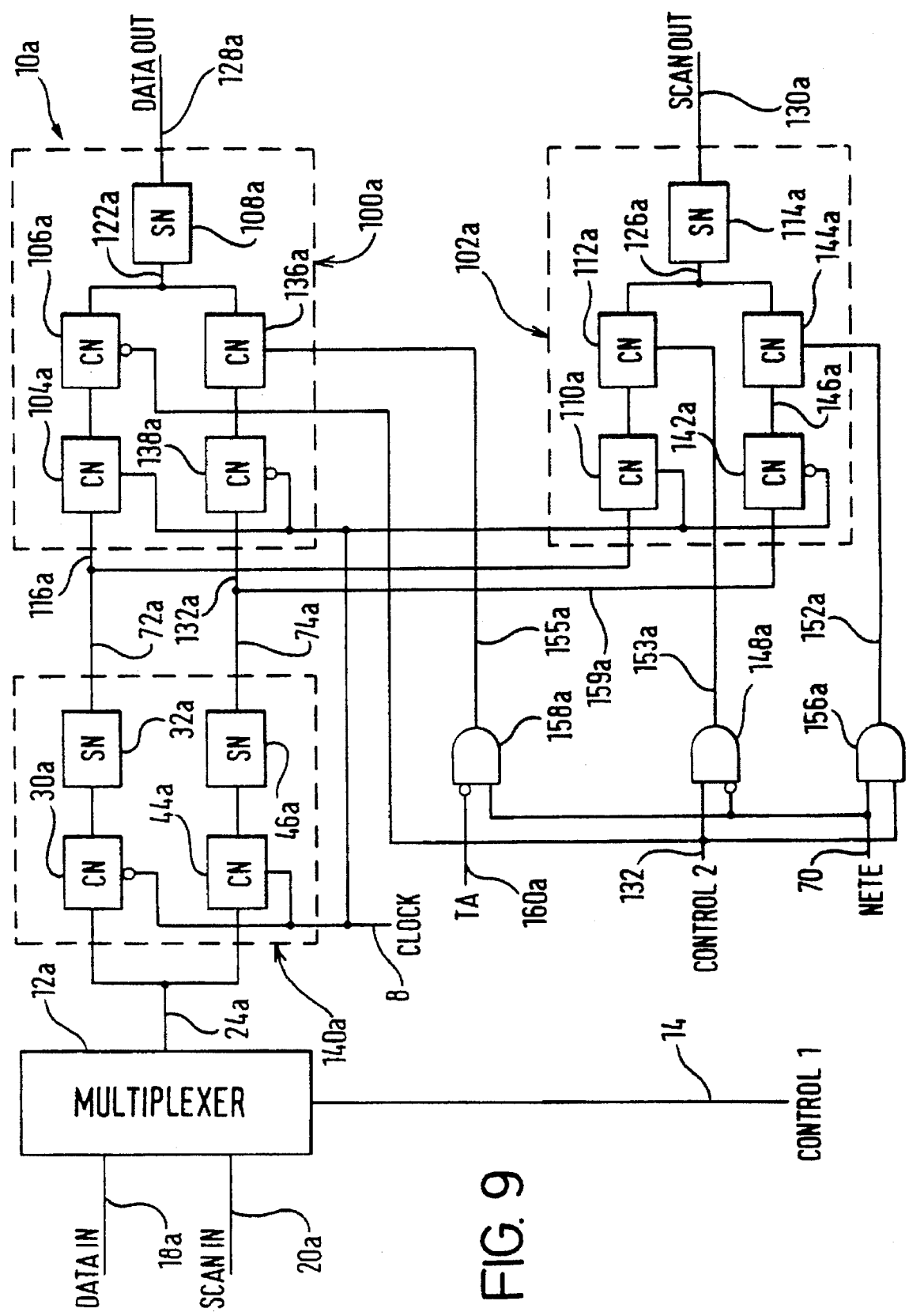
FIG. 9 is a circuit diagram of the known scan cell of FIG. 7 adapted in accordance with a further embodiment of the invention.

FIG. 9 shows the scan cell of FIG. 8 with a control node 142a and a control node 144a added to the release half latch 102a to provide a negative edge trigger capability. The input of the control node 142a on line 159a is connected to line 74a. The output of the control node 142a is connected to the input of the control node 144a via signal line 146a, and the output of the control node 144a is connected to the input line 126a of the storage node 114a. The control node 142a is controlled by the inverse of the clock signal CLOCK on line 8.

Logical AND gates 156a, 158a and 148a are also added to the circuit of FIG. 9. The AND gate 156a receives as a first input the control signal CONTROL2 on line 132 and as a second input the negative edge trigger enable control signal NETE on line 70, and its output on line 152a controls the control node 144a. The AND gate 148a receives as a first input the control signal CONTROL2 on line 132 and as a second input the inverse of the negative edge trigger enable control signal NETE on line 70, and its output on line 153a controls the control node 112a. The AND gate 158a receives as a first input the negative edge trigger enable control signal NETE on line 70 and as a second input signal the inverse of a test active control signal TA on line 160a, and its output on line 155a controls the control node 136a.

During normal functional operation when the scan cell is required to operate as a functional latch, the control signal CONTROL2 on line 132 is low such that the outputs of both the AND gates 156a and 148a are low. Consequently, both the control nodes 112a and 144a disconnect their inputs from their outputs and the half latch 102a is completely disabled. The test active control signal will also be low such that the control node 136a is controlled directly by the negative edge trigger enable control signal NETE. Consequently the scan cell will operate as either a positive edge triggered functional latch or a double edge triggered functional latch according to whether the negative edge trigger enable control signal is set or not.

It will be apparent from the foregoing description given with reference to FIG. 7 that during test mode an update operation can only take place on a positive going edge. The test active control signal TA on line 160a is therefore provided to ensure that the update half latch 100a is always configured as a positive edge triggered latch during scan test. However, it is not critical during scan test whether a release operation occurs on a positive edge transition or negative edge transition. Therefore the release half latch 102a can be controlled by the negative edge trigger enable control signal NETE on line 70 such that the release operation can be positive edge triggered or negative edge triggered, and in this way the negative edge triggered circuitry of the capture half latch 140a and the release half latch can be tested, the negative edge triggered circuitry comprising the control nodes (CN) 44a, 142a and 144a and the storage nodes (SN) 46a and 114a.

Table 1 summarises the operation of the circuit of FIG. 9 under the control of the signals TA, CONTROL2 and NETE.

TABLE 1

| TA | CONTROL2 | NETE | |
|---|---|---|---|
| 0 | 0 | 0 | Positive edge triggered latch-functional operation |
| 0 | 0 | 1 | Double edge triggered latch-functional operation. |
| 0 | 1 | 0 | Illegal |
| 0 | 1 | 1 | Illegal |
| 1 | 0 | 0 | Update on positive edge-test operation |
| 1 | 0 | 1 | Update on positive edge-test operation |
| 1 | 1 | 0 | Scanout on positive edge-test operation |
| 1 | 1 | 1 | Scanout on negative edge-test operation |

Figure 10:
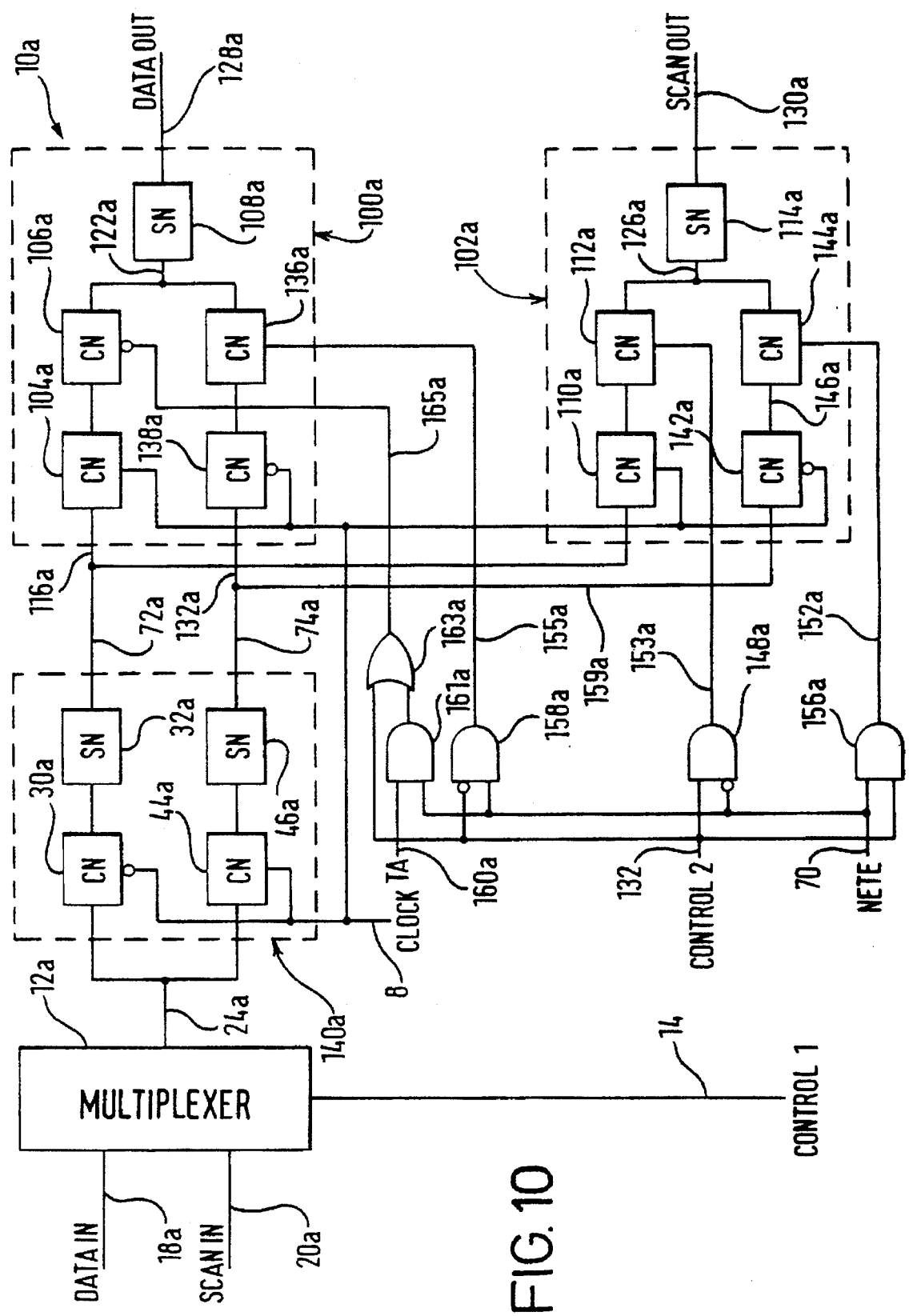
FIG. 10 is a circuit diagram of the known scan cell of FIG. 7 adapted in accordance with a still further embodiment of the invention.

The scan cell of FIG. 9 is still not completely scan testable, however, since the negative edge circuitry of the update half-latch 100a, comprising the control nodes 136a and 138a, cannot be tested. Referring to FIG. 10 there is shown an adaptation of the scan cell of FIG. 9 which is fully scan testable. Like reference numerals have been used in FIG. 10 to denote like parts in FIG. 9.

FIG. 10 shows the scan cell of FIG. 9 with the addition of an AND gate 161a and an OR gate 163a. The AND gate 161a receives as a first input the test active control signal TA on line 160a, and as a second input the negative edge trigger enable signal NETE on line 70. The OR gate 163a receives as a first input the control signal CONTROL2 on line 132, and as a second input the output of the AND gate 161a. The second input of the NAND gate 158a is now connected to the inverse of the control signal CONTROL2 on line 132.

During normal functional operation, when the scan cell is required to operate as a functional latch, the control signal CONTROL2 on line 132 is low such that the outputs of both the AND gates 156a and 148a are low. Consequently, both the control nodes 112a and 144a disconnect their inputs from their outputs and the half-latch 102a is completely disabled. The test active control signal TA on line 160a will also be low such that the output of the AND gate 161a is low. Hence the output of the OR gate 163a on line 165a will be low and the control node 106a will connect its input to its output. The output of the AND gate 158a on line 155a will then follow the negative edge trigger enable signal NETE on line 70, such that the control node 136a disconnects its input from its output when the signal NETE is low, and connects its input to its output when the signal NETE is high. Consequently during normal functional operation the scan cell of FIG. 10 will function as either positive edge triggered latch or a double edge triggered latch in dependance on the negative edge trigger enable signal NETE on line 70.

However, in the circuit of FIG. 10, to ensure testing of the negative edge triggered circuitry of the update half-latch 100a, during testing an update operation can be controlled to occur on either a positive or a negative going edge. When the signal CONTROL2 is low, the release half-latch 102a is disabled. The test active signal TA on line 160a will be high during a test, and hence when the negative edge trigger enable signal NETE on line 70 is low, the control node 106a is enabled and the control node 136a is disabled. Conversely under these conditions, when the negative edge trigger enable signal NETE on line 70 is high the control node 106a is disabled and the control node 136a is enabled. In this way during a test node an update operation can be peformed on both positive and negative edges and the scan cell of FIG. 10 is therefore fully scan testable.

It can therefore be seen that the circuit of FIG. 10 provides means for performing a structural scan test on both positive and negative clock edges. In this way the scan cell can be fully tested. For example, a positive edge triggered performance scan test could be performed to test the positive edge triggered logic of the scan cell (as well as the combinational logic under test), and then a simple structural test using the negative edge circuitry could be performed to test such circuitry. However, it will be apparent to a person skilled in the art having reference to the foregoing description that there are other combinations of test which can be performed to fully test the scan cell 10a of FIG. 10.

Table 2 summarises the operation of the circuit of FIG. 10 under the control of the signals TA, CONTROL2 and NETE.

TABLE 2

| TA | CONTROL2 | NETE | |
|---|---|---|---|
| 0 | 0 | 0 | Positive edge triggered latch-functional operation |
| 0 | 0 | 1 | Double edge triggered latch-functional operation |
| 0 | 1 | 0 | Illegal |
| 0 | 1 | 1 | Illegal |
| 1 | 0 | 0 | Update on positive edge-test operation |
| 1 | 0 | 1 | Update on negative edge-test operation |
| 1 | 1 | 0 | Scanout on positive edge-test operation |
| 1 | 1 | 1 | Scanout on negative edge-test operation |

Figure 11:
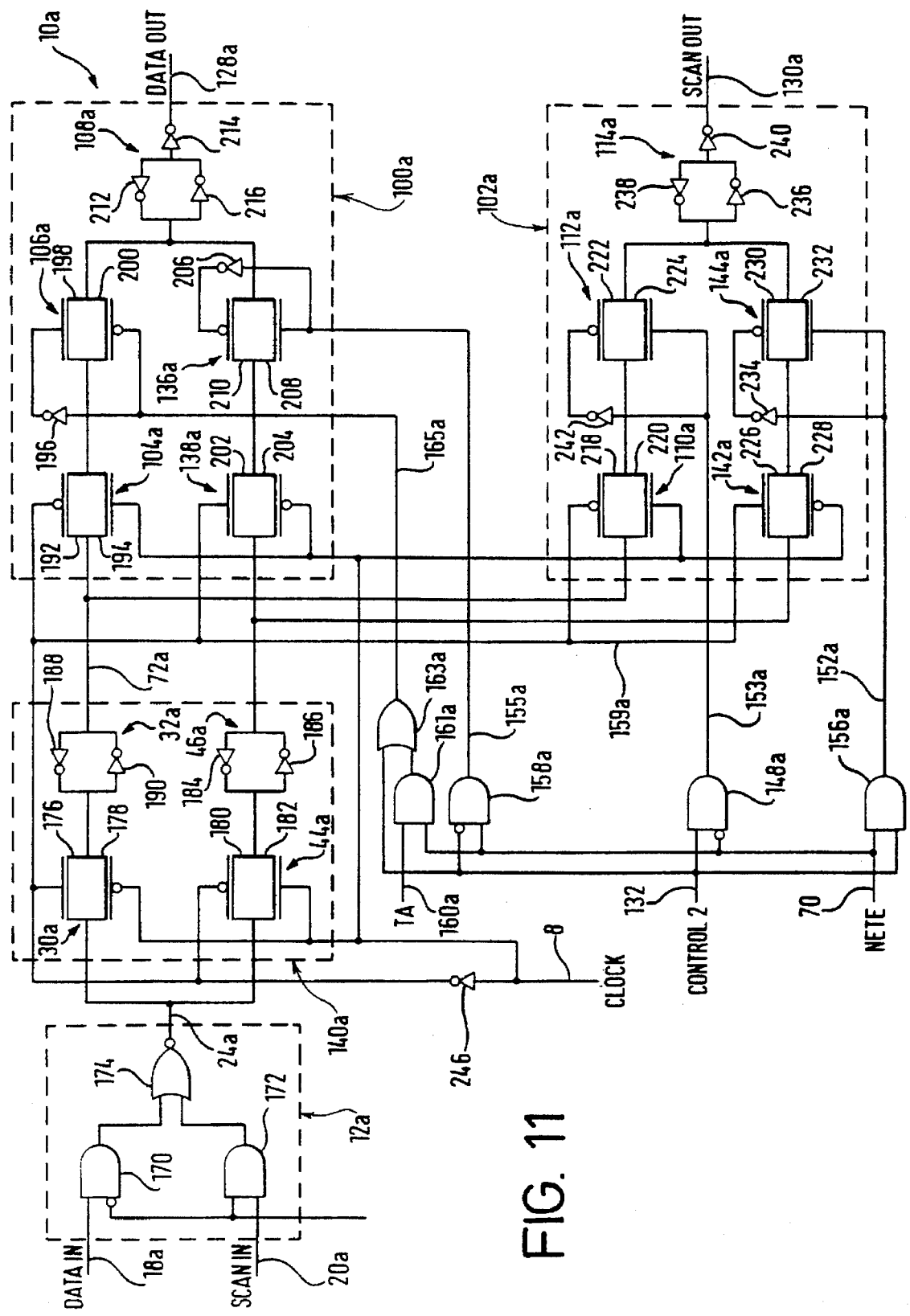
FIG. 11 is a circuit implementation of the scan cell used in the circuit of FIG. 10.

FIG. 11 is an illustrative example of one specific way of implemanting the scan cell 10a of FIG. 10 using known circuit components. Reference numerals are the same as for like parts in FIGS. 1 to 10.

The multiplexor 12a consists of two AND gates 170, 172 and a NOR gate 174, the AND gate 170 having one of its inputs inverted. The control node 30a comprises two complimentary transistors 176 and 178, the control node 44a comprises two complimentary transistors 180 and 182, the storage node 32a comprises a strong inverter 190 and a weak inverter 188, the storage node 46a comprises a strong inverter 186 and a weak inverter 184. The control node 104a comprises two complimentary transistors 192 and 194, the control node 138a comprises two complimentary transistors 202 and 204, the control node 106a comprises two complimentary transistors 198 and 200 and an inverter 196, the control node 136a comprises two complimentary transistors 208, 210 and an inverter 206, and the storage node comprises two strong inverters 214 and 216 and a weak inverter 212. The control node 100a comprises two complimentary transistors 218 and 220, the control node 142a comprises two complimentary transistors 226 and 228, the control node 112a comprises two complimentary transistors 222 and 224 and an inverter 242, the control node 144a comprises two complimentary transistors 230 and 232 and an inverter 234, and the storage node 114a comprises two strong inverters 236 and 240 and a weak inverter 238. The clock signal CLOCK is also input to an inverter 242 to generate the inverse clock signal NOTCLOCK. It should be apparent to a person skilled in the art having reference to the foregoing description of FIG. 9 how the circuit implementation of FIG. 10 operates, and this operation will therefore not be further described.

In practice the latches in the functional memory circuit may be more than one type, that is to say that some latches may be positive edge triggered only whilst others may be double edge triggered. When this is the case the scan chain formed in the scan test operation will be a mixture of positive edge triggered latches and double edged triggered latches. Such mixing of different types of scan latches is acceptable, but certain precautions need to be taken. If a double edge triggered latch is configured as a negative edge triggered latch for test purposes and such latch follows immediately after a positive edge triggered scan latch in the scan chain, the scan data transferred to the output of the positive triggered scan latch has half a clock cycle to get from the scan output of the positive edge triggered latch to the negative edge triggered latch. Such time is sufficient so as not to cause any loss of data. However, where a positive edge triggered scan latch follows a negative edge triggered scan latch, a delay needs to be inserted between the two to prevent 'shoot-through'. The mixing of positive and negative edge triggered scan latches and the problems and corresponding solutions therewith are known in the art.

Figure 12:
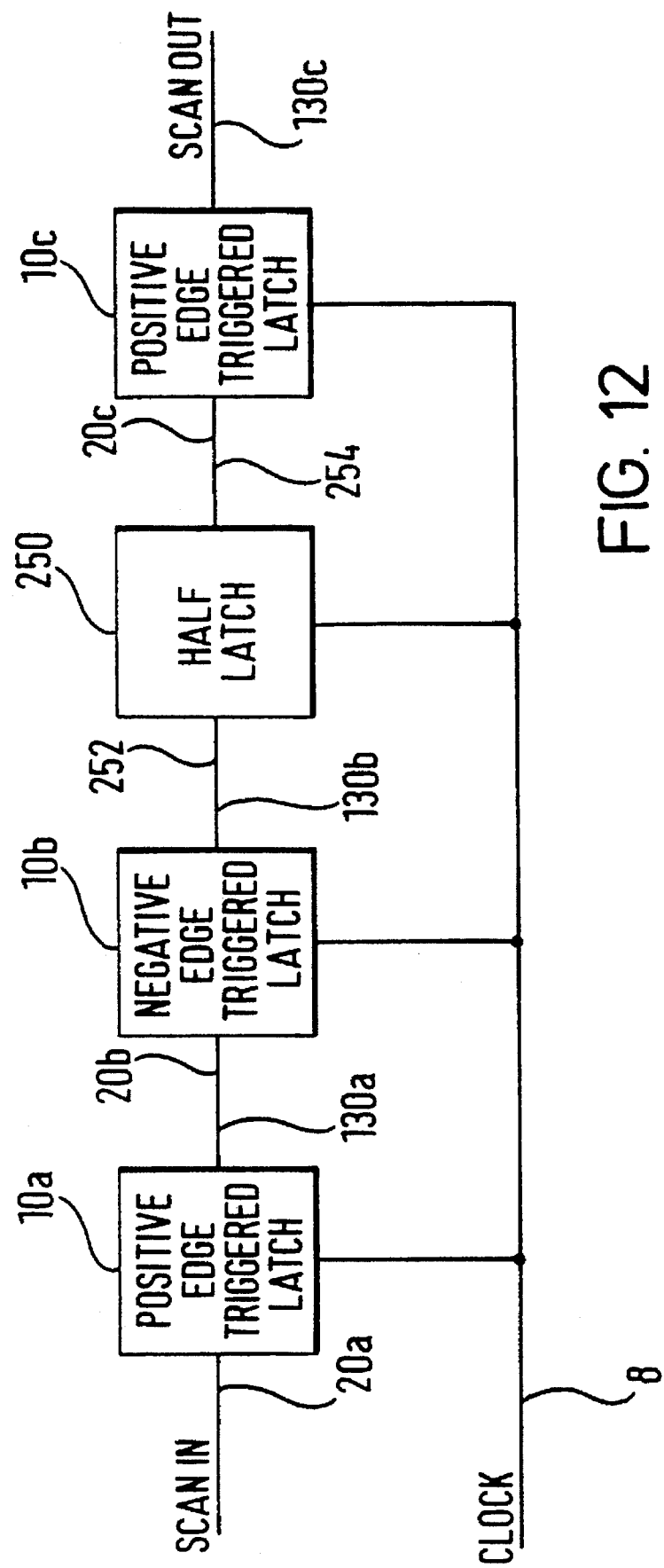
FIG. 12 is a block diagram illustrating how scan cells according to different embodiments of the invention may be interconnected.

FIG. 12 shows an illustrative example of how this problem may be overcome. A scan chain comprising of a positive edge triggered latch 10a connected to a negative edge triggered latch 10b which in turn is connected to a positive edge triggered latch 10c is protected against data loss by inserting a delay element comprising a half latch 250 between the negative edge triggered latch 10b and the positive edge triggered latch 10c. The latches 10a, 10b, 10c and the half latch 250 are all clocked by the clock signal CLOCK.

What is claimed is:

1. A scan cell having:

a data input terminal and a data output terminal;

a first latch connected to receive an input signal from the data input terminal and having a first data output path connected to the data output terminal and which is triggered on a positive edge of a clock signal to transfer the input signal to the data output terminal;

a second latch connected to receive said input signal from the data input terminal and having a second data output path connected to the data output terminal and which is triggered on a negative edge of said clock signal to transfer the input signal to the data output terminal;

a first switch connected in the second data output path and responsive to a negative edge trigger disable control signal (NETE) to selectively disconnect said second data output path, whereby with the second data output path connected, the scan cell functions as a double edge triggered latch, and with the second data output path disconnected, the scan cell functions as a positive edge triggered latch, whereby the scan cell can be scan tested.

2. The scan cell of claim 1, wherein each latch comprises first and second half latches selectively operable in one of a data transfer state and a data retention state.

3. The scan cell of claim 1 or claim 2, further comprising: a second switch connected in the first data output path and responsive to a negative edge trigger test control signal (NETT) to selectively disconnect said first data output path, whereby the scan cell functions as a negative edge triggered latch when the first data output path is disconnected and the second data output path is connected.

4. The scan cell of claim 2, wherein said clock signal is applied to control terminals of the first half latches of the first and second latch such that when one half latch is in the data transfer state the other half latch is in the data retention state, and said clock signal is applied to the control terminals of the second half latches of the first and second latch such that when one half latch is in the data transfer state the other is in the data retention state.

5. The scan cell of claim 2 or claim 4, further comprising:

a scan output terminal and a first scan half latch selectively operable in one of a data transfer state and a data retention state in response to said clock signal supplied to a control terminal of the first scan half latch;

said first scan half latch being in a first scan path extending between the output of the first half latch of the first latch and the scan output terminal to form with said first half latch of said first latch a positive edge triggered latch.

6. The scan cell of claim 5 further comprising:

a second scan half latch selectively operable in one of a data transfer state and a data retention state in response to said clock signal supplied to a control terminal of the second scan half latch, said second scan half latch being in a second scan path extending between the output of the first half latch of the second latch and the scan output terminal to form with said first half latch of said second latch a negative edge triggered latch;

a second switch connected in the first scan path and responsive to the negative edge trigger disable signal (NETE) to selectively disconnect said first scan path; and a third switch connected in the second scan path and responsive to the negative edge trigger disable signal (NETE) to selectively disconnect said second scan path;

wherein, when one scan path is connected the other is disconnected, and the first half latch of the second latch and the second scan half latch function as a negative edge triggered latch when the first scan path is disconnected and the second scan path is connected.

7. The scan cell of claim 6, wherein the clock signal is applied to the control terminal of the second scan half latch such that when one scan half latch is in the data transfer state the other is in the data retention state.

8. The scan cell of claim 4, further comprising:

a scan output terminal and a first scan half latch selectively operable in one of a data transfer state and a data retention state in response to said clock signal supplied to a control terminal of the first scan half latch;

said first scan half latch being in a first scan path extending between the output of the first half latch of the first latch and the scan output terminal to form with said first half latch a positive edge triggered latch; and a second switch connected in the first data output path and responsive to a select scan output control signal (CONTROL2) to selectively disconnect said first data output path.

9. The scan cell of claim 8, further comprising:

a third switch connected in the first scan path and responsive to the select scan output control signal (CONTROL2) to selectively disconnect said first scan path, whereby when one of the first data output path and the first scan path is connected the other one of the first data output path and the first scan path is disconnected.

10. The scan cell of claim 8, further comprising:

a second scan half latch selectively operable in one of a data transfer state and a data retention state in response to said clock signal supplied to a control terminal of the second scan half latch, said second scan half latch being in a second scan path extending between the output of the first half latch of the second latch and the scan output terminal to form with said first half latch of said second latch a negative edge triggered latch; and a fourth switch connected in the second scan path and responsive to a logical combination of the select scan output control signal (CONTROL2) and the negative edge trigger enable control signal (NETE) to selectively disconnect said second scan path;

wherein the second switch is responsive to the select scan output control signal (CONTROL2) logically combined with the negative edge trigger enable control signal (NETE) to selectively disconnect said first scan path, whereby when any one of the first data output path, the first scan path, and the second scan path is connected, the other two are disconnected.

11. The scan cell of claim 10, wherein the clock signal is applied to the control terminal of the second scan half latch such that when one scan half latch is in the data transfer state the other is in the data retention state, the one scan half latch being in the data transfer state simultaneously with the first half latch of the first latch.

12. The scan cell of claim 1, wherein the first switch is responsive to a logical combination of the negative test disable control signal (NETE) and a test active control signal (TA) to selectively disconnect said second data output path.

* * * * *